(12) United States Patent
Dasu et al.

(10) Patent No.: US 8,710,864 B2
(45) Date of Patent: Apr. 29, 2014

(54) DYNAMICALLY RECONFIGURABLE SYSTOLIC ARRAY ACCELERATORS

(75) Inventors: Aravind Dasu, Providence, UT (US); Robert C. Barnes, Albuquerque, NM (US)

(73) Assignee: Utah State University, Logan, UT (US)

( * ) Notice: Subject to any disclaimer, the term of this patent is extended or adjusted under 35 U.S.C. 154(b) by 541 days.

(21) Appl. No.: 13/092,748

(22) Filed: Apr. 22, 2011

(65) Prior Publication Data

US 2011/0264888 A1    Oct. 27, 2011

Related U.S. Application Data

(60) Provisional application No. 61/327,365, filed on Apr. 23, 2010.

(51) Int. Cl.
*H03K 19/177* (2006.01)
(52) U.S. Cl.
CPC ................................ *H03K 19/17756* (2013.01)

USPC .............................................. 326/38; 326/41
(58) Field of Classification Search
CPC .......... H03K 19/177; H03K 19/17704; H03K 19/17724; H03K 19/17728; H03K 19/17736; H03K 19/17756
USPC ................................................. 326/37–41, 46
See application file for complete search history.

(56) References Cited

U.S. PATENT DOCUMENTS 8,554,972 B2 * 10/2013 Koch et al. ..................... 710/305
2010/0223237 A1 * 9/2010 Mishra et al. .................. 707/693

* cited by examiner

*Primary Examiner* — Don Le (57) ABSTRACT

A polymorphic systolic array framework that works in conjunction with an embedded microprocessor on an FPGA, that allows for dynamic and complimentary scaling of acceleration levels of two algorithms active concurrently on the FPGA. Use is made of systolic arrays and hardware-software co-design to obtain an efficient multi-application acceleration system. The flexible and simple framework allows hosting of a broader range of algorithms and extendable to more complex applications in the area of aerospace embedded systems.

14 Claims, 7 Drawing Sheets

DYNAMICALLY RECONFIGURABLE SYSTOLIC ARRAY ACCELORATORS

RELATED APPLICATIONS

This application claims the benefit under 35 U.S.C. §119 (e) of U.S. Provisional Patent Application No. 61/327,365 filed Apr. 23, 2010, and titled "Dynamically Reconfigurable Systolic Array Accelerator" which is incorporated herein by reference.

GOVERNMENT LICENSE RIGHTS

This invention was made with government support under Grant No. NNG06GE54G awarded by NASA. The government has certain rights in the invention.

TECHNICAL FIELD

The present invention relates to dynamic and complimentary scaling of algorithms active concurrently on a Field Programmable Gate Array.

BACKGROUND

Over the past few years SRAM (static random access memory) based FPGAs (field programmable gate array) have made significant strides in device fabric features, such as support for partial dynamic reconfiguration, immersed IP (intellectual property) components (including embedded Xilinx's DSP48 and Block RAM (BRAM) modules) and design automation tools to take advantage of these features. Their ASIC (application specific integrated circuits) like computational capabilities and post-launch reconfiguration features make them a viable alternative to replace microprocessors as on-board computers.

The caveat is that the sophistication of the design ported on an FPGA depends on the designer exploring the computation nature of target algorithms, the flexibility they need in terms of acceleration, judicious use of classical techniques such as hardware-software partitioning in conjunction with newer methods of on-chip bitstream decompression and relocation.

In one application example, to navigate in space an autonomous spacecraft must accurately estimate its state from noisy measurements. The Kalman filter (KF) processes each of these measurements and returns the optimal estimate of the state and the error covariance. The computational complexity of even the simple linear KF makes it difficult to run the filter efficiently (i.e. fast enough) on traditional on-board microprocessors. KF acceleration approaches use both novel parallel architectures and algorithm enhancements to make the filter more computationally efficient. Hardware implementations of KF have been shown to dramatically improve performance. KFs are composed of basic matrix operations: multiplication, addition, subtraction, and inversion. These operations can be efficiently implemented as systolic arrays (SA), particularly by using the Faddeev algorithm, the benefits of which stem from its regularity, scalability, and its potential for linearity, and small area requirements.

There have been some implementations of linear KFs on FPGAs but these do not address some of the limitations of specific features of the FPGA platform such as microprocessor or memory interfaces. During run-time the system model or requirements may change due to environment changes, sensor/actuator failure, or at scheduled times. Some have proposed reconfigurable systems to handle these situations, however previous approaches uses soft-reconfiguration, which merge the designs of multiple filters. However no KF implementation invokes dynamic reconfiguration of the hardware.

DETAILED DESCRIPTION OF THE INVENTION

Specification

FPGAs are increasingly being adopted as the primary on-board computing system for autonomous deep space vehicles. The need to support several complex applications for navigation and image processing in a rapidly responsive on-board FPGA based computer, requires exploring and combining several design concepts such as systolic arrays, hardware-software partitioning, and partial dynamic reconfiguration (PDR). A microprocessor-coprocessor design is employed that can simultaneously accelerate two single precision floating-point algorithms: e.g., extended Kalman filter (EKF) and a discrete wavelet transform (DWT). Contributions include:

(i) a polymorphic systolic array framework comprising of reconfigurable partial region based sockets 150 to accelerate algorithms amenable to being mapped onto linear systolic arrays. When implemented on a low end Xilinx Virtex4 SX35 FPGA the design provides a speedup of at least 4.1 8× and 6.6 1× over a state of the art microprocessor used in spacecraft systems for the EKF and DWT algorithms respectively.

(ii) Switch boxes 140 to enable communication between static and partial reconfigurable regions 150 and a simple protocol to enable schedule changes when a socket's contents are dynamically reconfigured to alter the concurrency of the participating systolic arrays.

(iii) A hybrid PDR method that combines Xilinx early access partial reconfiguration (EAPR), on-chip bitstream decompression and bitstream relocation to enable fast scaling of systolic arrays on the Polymorphic systolic array framework. This technique provided a 2.7× improvement in reconfiguration time compared to an off-chip partial reconfiguration technique that used a Flash card on the FPGA board.

A technique to augment PDR is the concept of bitstream relocation. It involves slightly modifying the contents of a PB to mould it into a form that can be loaded onto a similar but different partial configuration region on the device. These methods are strongly tied to a specific family of devices and system architecture on the FPGA. One embodiment is implemented by adding the decompression algorithm for obtaining the next word in the bitstream. However this solution does not allow static routing in the partial regions.

While each of the PDR enabling/enhancing methods is effective to a certain extent, a polymorphic systolic array can benefit considerably through a suitable application of a combination of these prior methods.

We disclose the system architecture implemented on the FPGA, comprising of a microprocessor 110, a coprocessor 130 with a pseudo-cache 120, controller 210 and Polymorphic systolic array framework. Then we disclose the mapping of the EKF and DWT algorithms onto this architecture and how on-chip bitstream decompression/relocation methods are used to facilitate dynamic scaling of the Polymorphic systolic array framework.

In one embodiment a system combines an EKF and a DWT on a Xilinx Virtex-4 SX35 FPGA using a flexible and dynamically scalable systolic array co-processor and a MicroBlaze host processor. The design uses a combination of techniques such as dynamic partial bitstream decompression (PBD), partial bitstream relocation (PBR) and floor planning of partial reconfiguration (PR) regions.

While the KF is a well understood algorithm, it cannot accurately model the non-linearity of complex real world problems, for example, for navigation/guidance. Instead the EKF a variant of the linear KF which dynamically linearizes the non-linear system equations to enable state estimation is used. The difficulty in porting the EKF onto an FPGA is calculating the non-linear portions of the algorithm. Moreover these non-linear equations can change completely from one problem to another necessitating a new architecture to be designed for each specific problem. Therefore we partition the EKF into linear and non-linear components that can be solved on a co-processor accelerator and software respectively.

Many image/signal applications such as compression, target recognition, classification etc. are composed of algorithms that can be accelerated by linear SAs. A subset of these algorithms and their SA implementations include: DWT, K-means clustering, Bayes classifier, Eigen value calculation etc. The DWT algorithm, a powerful filtering algorithm, in particular has been used in aerospace applications for both on-board and off-line image compression. While the principles behind the wavelet transform are known to those skilled in the art, we disclose a convolution kernel based DWT algorithms, principally consist of using separable 1D (dimension) filters along the horizontal and vertical directions each followed by sub-sampling. This process is often repeated several times (also called decomposition) to obtain a data structure that can be efficiently compressed.

PDR is the process of reconfiguring only a portion of an FPGA at run-time, after initial configuration, while the other portions remain active. The EAPR methodology from Xilinx is the most supported approach, hence used in one embodiment. However with EAPR for the Virtex4 class of FPGA devices there are a few caveats. Two partial regions may not overlap vertically in the same clock region. Therefore a clock region dictates the granularity of the partial region sizes in the floor planning phase.

As the complexity of FGPA architectures have increased, so has the bitstream size that is required to configure the device. With PDR methods being actively explored, there has been a need to reduce the size of the bitstreams. This has resulted in the exploration of classic compression algorithms by the FPGA community. We disclose a Run-Length Encoding (RLE) for the compression of partial bitstreams (PB) as it provides a consistently good quality of performance for most of the example cases without the need for storing a dictionary on scarce BRAM resources.

Figure 1:
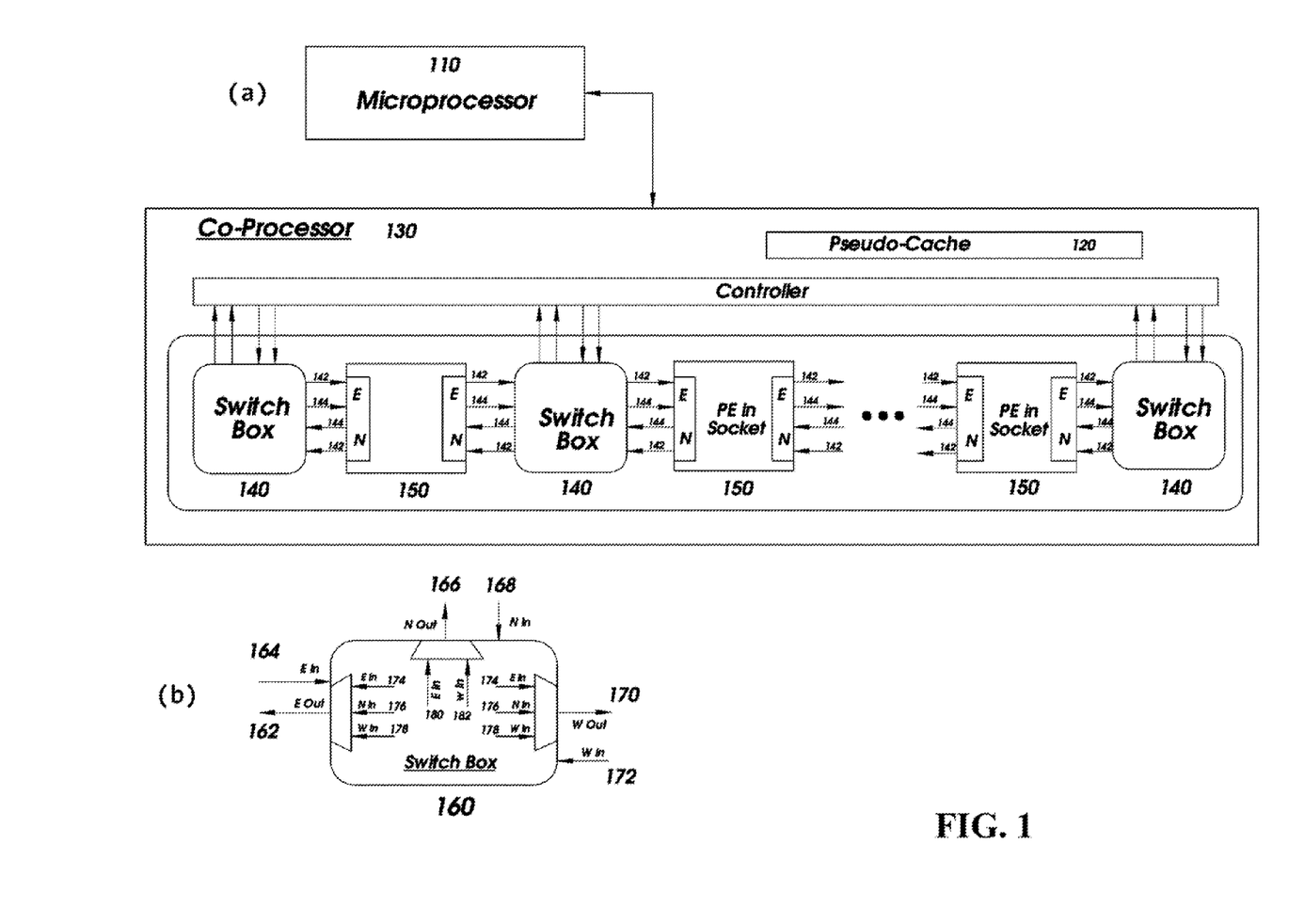
FIG. 1: Generic polymorphic systolic array framework. Each PE in a socket communicates east and west with 32-bits for data and 4-bits for control, routed through static bus macros (BM) that connect to programmable switch boxes. Using three MUXs, the switch boxes can route signals to/from the pseudo-cache, loop signals back to the source socket, or route a signal to the next socket.

The system on the FPGA consists of a microprocessor 110 and a co-processor 130 (FIG. 1a). One embodiment uses the Xilinx soft-core MicroBlaze processor with an internal floating-point unit and attached memory. The microprocessor 110 serves three purposes: (i) It is available for computing portions of an algorithm that are deemed better suited for execution in software. For instance, in the EKF algorithm, the non-linear functions are well suited for software based execution. (ii) It hosts software necessary to support partial dynamic reconfiguration, bitstream decompression and relocation. (iii) It is responsible for controlling and scheduling operations onto the co-processor.

The co-processor 130 consists of the Polymorphic systolic array framework, a controller 210 and a pseudo-cache 120. It is controlled by instructions sent from the embedded microprocessor 110 and transacts with a pseudo-cache 120 for data. The pseudo-cache 120 is so named because while it does not have all the features of a traditional cache, it serves as a partially refreshable buffer storing a sub-set of the microprocessor memory's contents and provides low latency access to the co-processor 130. The size of the pseudo-cache 120 is determined by the number of available BRAMs. A table on the microprocessor 110 keeps dirty bits for both memories. If data is made dirty by the microprocessor 110 the corresponding pseudo-cache 12 blocks are freed, the data must be sent back to the co-processor 130 if it's used there again. If data is made dirty by the co-processor the cached version is sent back to the microprocessor 110 when it's used there. This ensures data is only synchronized between the microprocessor 11 and co-processor 130 when necessary. Instructions for reading or writing data to the co-processor 13 from the microprocessor 110, reading and writing data from the co-processor 13 pseudo-cache 120 to the Polymorphic systolic array framework, programming the switch boxes 140, and resetting the co-processor 130 are made available. One embodiment on the V4 SX35 FPGA had a co-processor 130 pseudo-cache 120 of 4K words, with 128 lines/blocks, and 32 words per block with fully associative mapping.

In one embodiment the Polymorphic systolic array framework is composed of Sockets 150 that are PR regions (FIG. 1a). Each socket 150 has four 32-bit buses 142 and four 4-bit buses 144 that link it to two neighboring switch boxes. The 32-bit buses 142 are intended to allow PEs residing in a socket to receive and send single precision floating-point data types. The 4-bit buses 144 are intended to carry control information. Within a socket 150, asynchronous busmacros (BM) are inserted to allow wires in the static regions to connect to wires in the PR region. Each switch box 160 (FIG. 1b) consists of three multiplexers that can be programmed to allow routing along the east-west directions 164, 162, 170, 172, east/west-north 166, 168 and loops (east-east or west-west). By coordinating the reconfiguration of sockets, controlling the multiplexers inside switch boxes, it is possible to dynamically scale the number of participating PEs in a systolic array.

Figure 2:
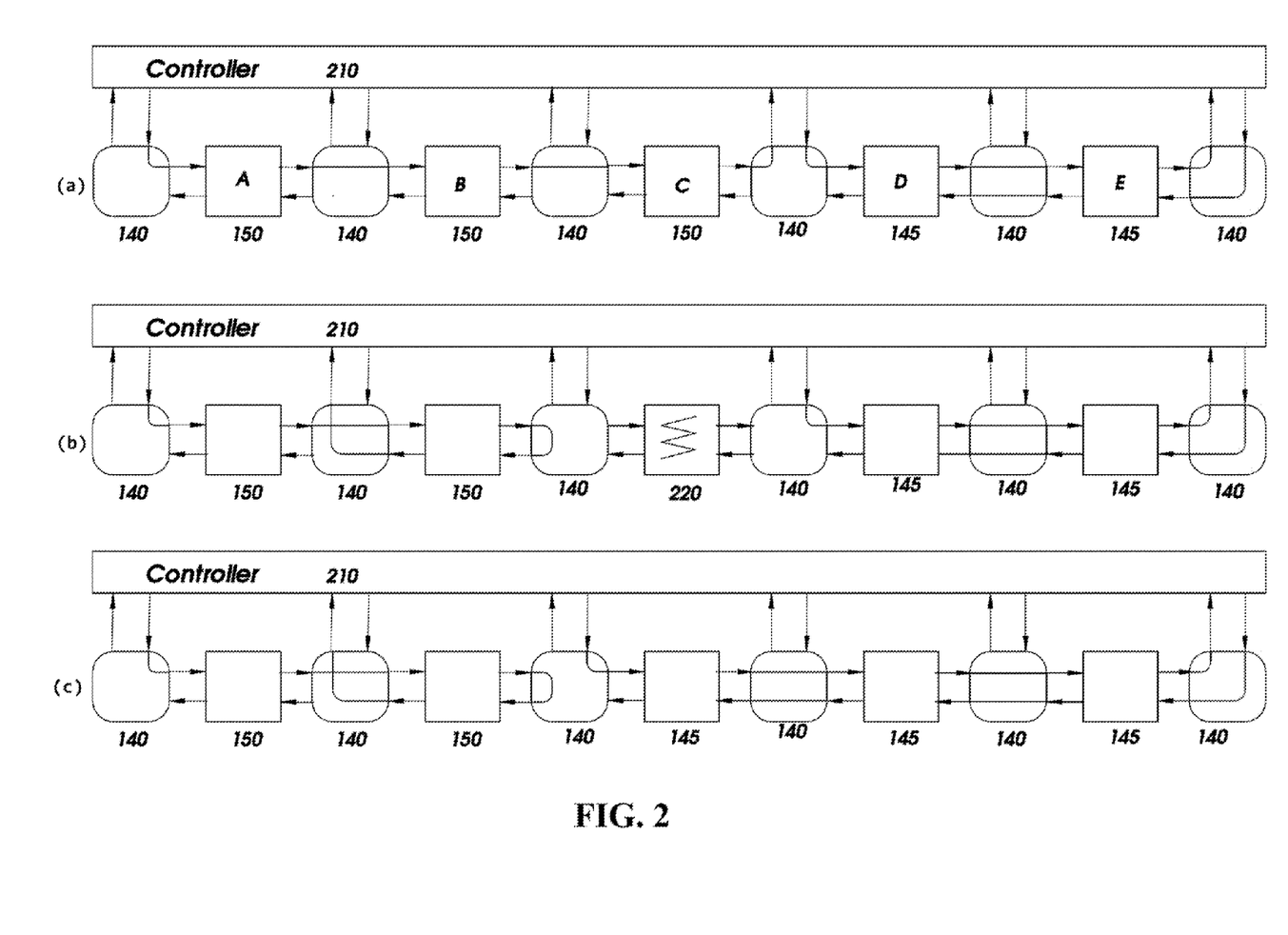
FIG. 2: Example of scaling the Polymorphic systolic array framework. (a) The Polymorphic systolic array framework running with 3 sockets (A, B, C) assigned to application #1 and 2 sockets (D, E) assigned to application #2. (b) Socket C is disconnected by reprogramming the neighboring switch boxes. It is then reconfigured to support a systolic array PE of application #2. (c) After reconfiguration of socket C, the registers in this socket are reset, then it is connected to the systolic array PEs of application #2 (D, E) by reprogramming the neighboring switch box.

When two systolic arrays are concurrently sharing the Polymorphic systolic array framework, it is possible to scale-up one systolic array by increasing the number of sockets to host its PEs, at the cost of scaling-down a proportional number of PEs belonging to the other systolic array. One embodiment uses the transfer of control protocol shown with an example in FIG. 2. The first step involves disconnecting a socket 150 (socket C in FIG. 2) from the SA it currently belongs to (App 1). This requires re-routing data and control signals inside neighboring switch boxes 140 (FIG. 2a). The second step (FIG. 2b) involves reconfiguring the socket 220 by initiating the process from the microprocessor via the OPB HWICAP (on-chip peripheral bus based hardware internal configuration access port). During this process both systolic arrays, are still functional, albeit with one of them having a lesser number of PEs. The third step involves resetting the PE in the newly configured socket, because it is not possible to set contents of registers in this region to a default known state (a limitation of EAPR). The fourth step involves re-routing signals in the appropriate switch boxes to augment SA of application 2 with the newly created PE (FIG. 2c).

The EKF algorithm was partitioned into non-linear functions (state prediction, measurement prediction and solving the Jacobian matrices) and matrix operations (state error covariance prediction, measurement residual, covariance of the measurement residual, Kalman gain calculation, state estimate update and state error covariance estimate update). The non-linear functions are unique to each EKF instance therefore they are implemented in software on an embedded microprocessor. However, since the matrix operations in predict and update phases are consistent across many EKF instances and vary only in size, so they are mapped onto the systolic array in the co-processor using the Faddeev algorithm. This algorithm is a popular method for computing the Schur Compliment, $D+CA^{-1}B$ (where DP×M, AN×N, BN×M, CP×N are all matrices), given an arrangement $$\begin{bmatrix} A & B \\ C & D \end{bmatrix}.$$

By properly arranging the four inputs any three operations (matrix inverse, multiplication and addition) or a combination of the three can be performed. For example, to add two matrices X and Y, A must be set to an identity matrix, B assigned to X, C set as an identity matrix and D assigned to Y. This resolves to $Y+I*I^{-1}*X=Y+X$.

TABLE 1

Boundary Cell

| Matrix Row | $|X| > |P|$ | Q | swap | New P |
|---|---|---|---|---|
| A/B | 1 | $-P/X$ | 1 | X |
|  | 0 | $-X/P$ | 0 | P |
| C/D | 1/0 |  |  |  |

TABLE 2

Internal Cell

| swap | New P |
|---|---|
| 1 | X |
| 0 | P |

Figure 3:
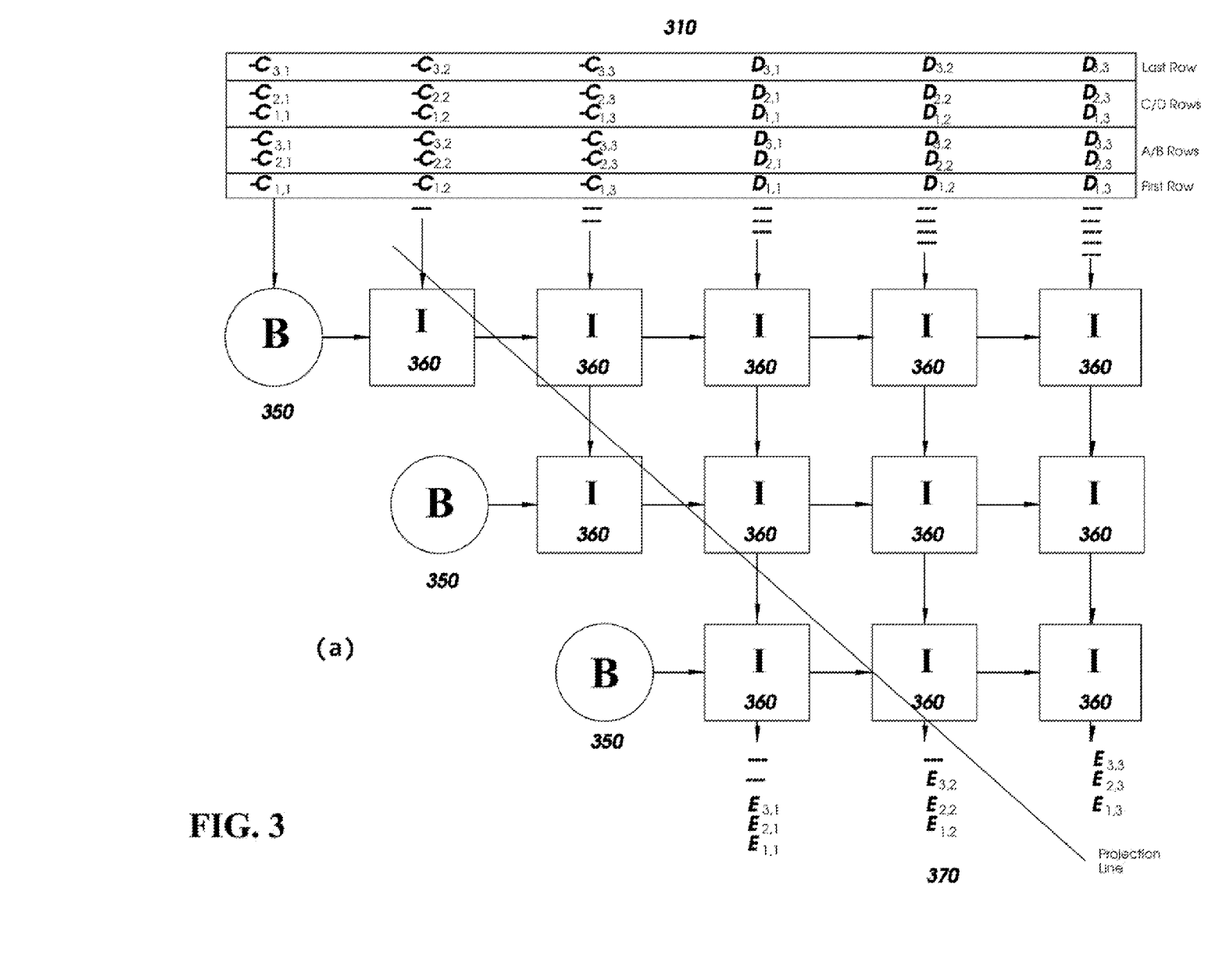
FIG. 3: 2D SA mapping of the Faddeev algorithm.
Figure 4:
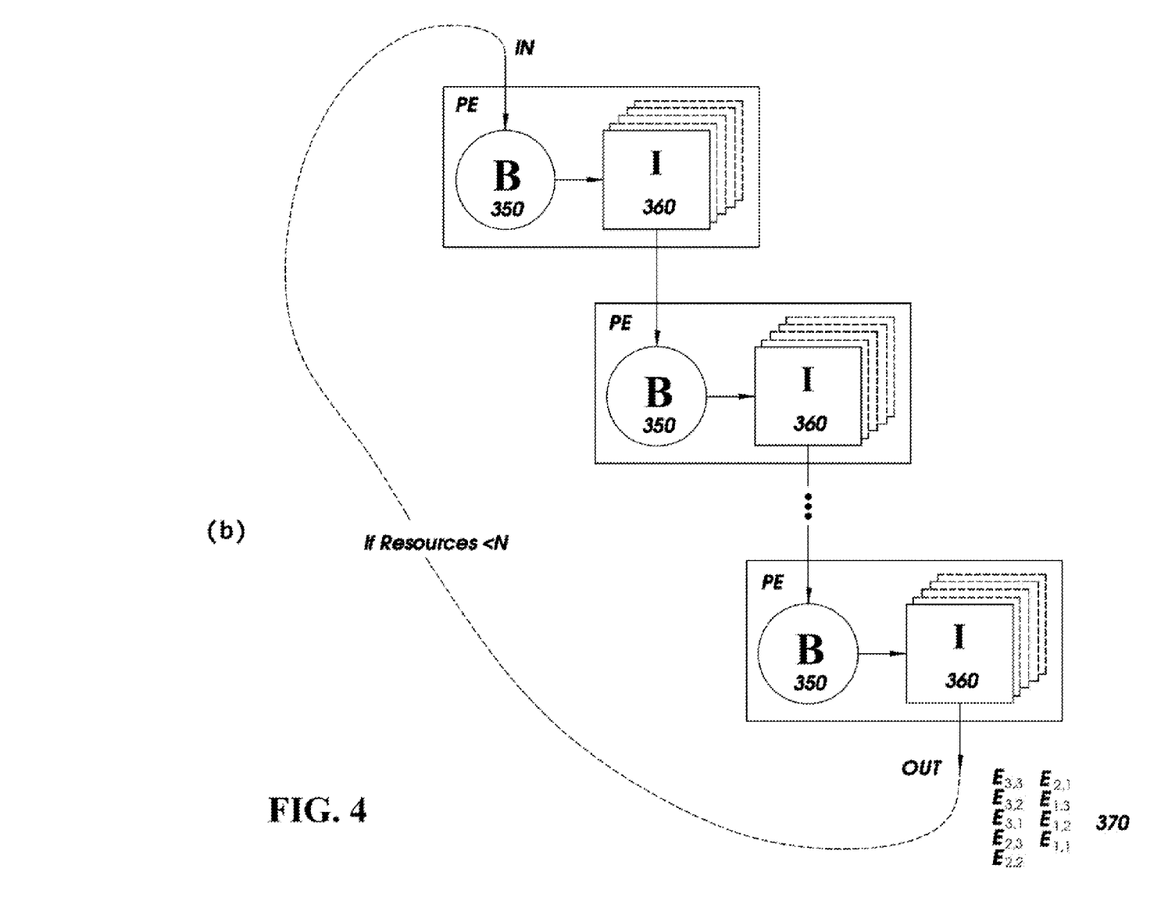
FIG. 4: 1D SA obtained via vertical projection.
Figure 5:
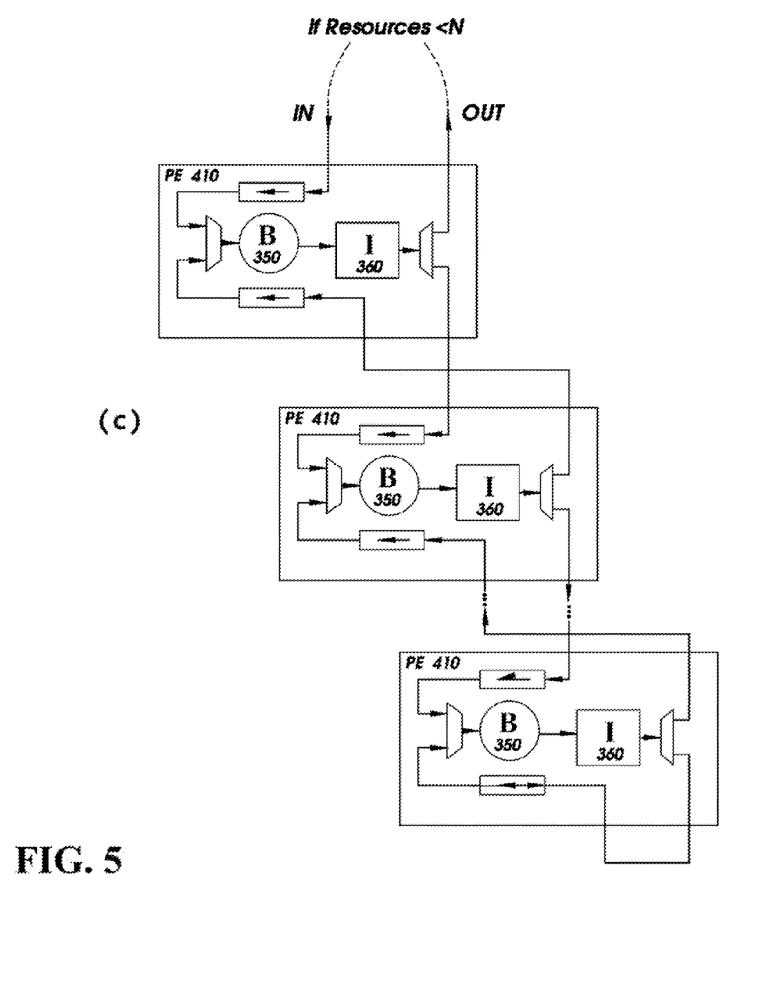
FIG. 5: 1D FSA with looping to improve resource utilization.
Figure 6:
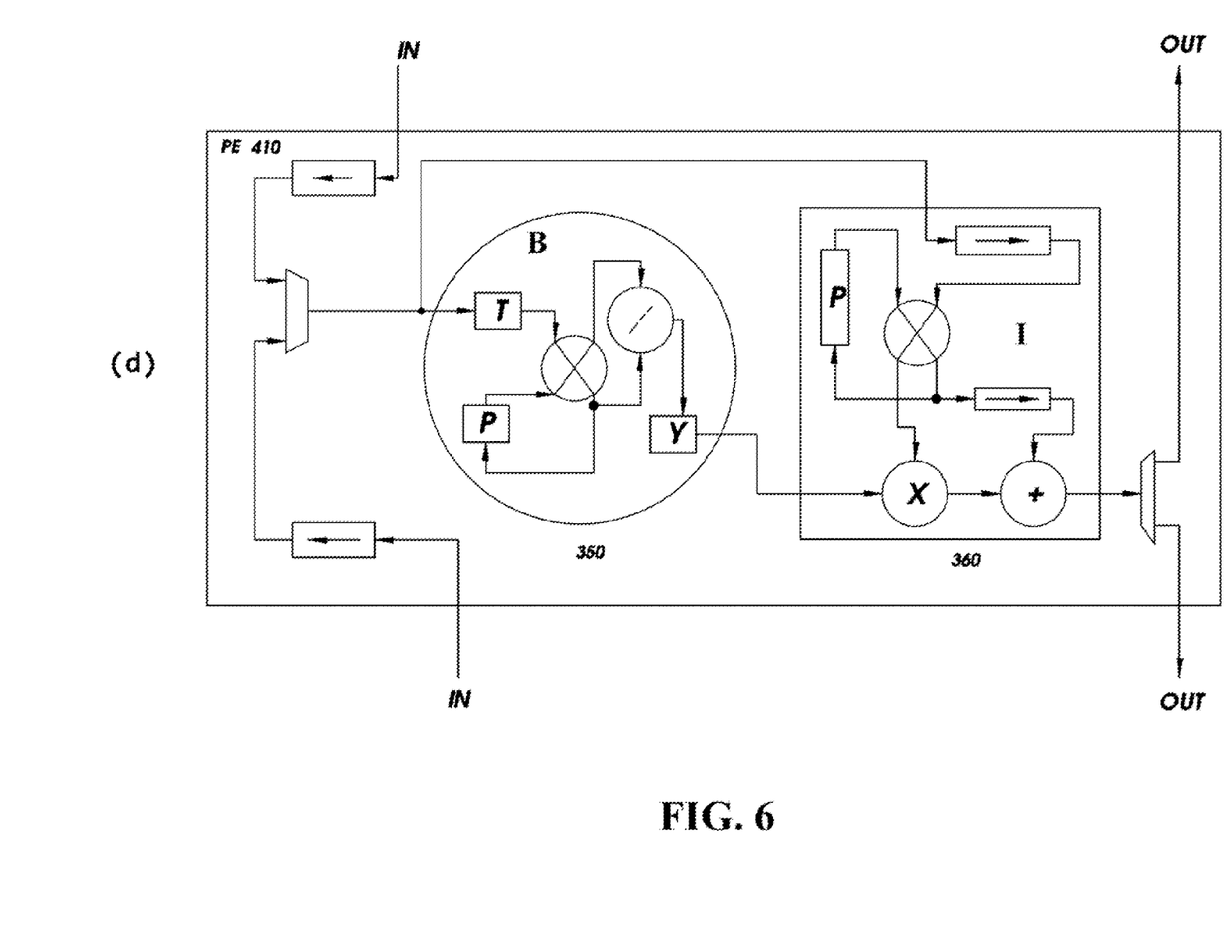
FIG. 6: Internal architecture of the 1D FSA PE (control signals are omitted).

A 2D SA scales by O(2N) PEs while a 1D linear SA scales by O(1). In order to have reasonable granularity for scaling in this application, a linear SA was designed by projecting the 2D array 310 onto a vertical array consisting of one boundary cell 350 and one internal cell 360 on each level as shown in FIGS. 3 and 4. Tables 1 and 2 summarize the functionality of the boundary 350 and internal 360 cells of FIG. 3 respectively, where X is the input element from the top, P is an internal register contained in each cell, Q is the quotient passed from the boundary cell to each internal cell of a row, and swap is a control signal which is also passed from the boundary cell to each internal cell of a row. Each element in the stream is tagged as either the first row, last row, A/B row or C/D row as shown in FIG. 1a and scheduled onto the 1D SA as shown in FIG. 4. A PE is initialized (internal FIFO register is filled) when it receives the elements of the first row, performs triangulation of A when it receives elements of NB rows, performs annulling C when it receives elements of C/D rows and is un-initialized (internal FIFO register is emptied) when it receives elements of the last row. For a scalable SA the number of processing elements (PE) in a SA and the size of the input must be independent, since the number of PEs can change irrespective of the input. In this vertical mapping an oversized data set is handled by recursively processing the data until the result is reached (symbolized as a loop back dotted line in FIGS. 4 and 5). As the number of PEs increases the number of times the output needs to be recursively processed is proportionally reduced according to $$\left[\frac{N}{2R}\right]$$

where R is the number of resources/sockets and N is the height and width of the A input matrix. For an input of size 4N×N (where A, B, C, D are of size N×N) the size of the final output is N×N and output of each level is (2N−i)×(2N−i) for i=1 ... N. Even if another stream is started immediately after the first, there will be a gap of control steps in the data stream where the PEs are not being utilized. So the data stream is looped back through the PEs to increase utilization. Each PE buffers both top and bottom input streams, and then multiplexes each stream to the boundary and internal cells (FIG. 5). This systolic array will henceforth be referred to as an FSA (Faddeev systolic array). The internal structure of the PE with pipelined single precision floating-point cores is shown in FIG. 6 which comprises of FIFO registers, buffers 710, switches 720 and single precision floating-point arithmetic cores 790.

It can be observed that if each arithmetic operation had a latency of one this architecture would be inefficient, but in the case of single precision arithmetic, each operation takes multiple cycles. For instance, the single precision floating-point divider is the largest floating-point core in the design. Its area was reduced by 70% so that it could fit within a PE constrained to one clock region of the FPGA. In one embodiment this was accomplished by reducing its input rate from one element every clock cycle to one element every 14 clock cycles. So after the divider starts calculating one element, up to 14 elements of the previous row (stored in internal FIFO buffers) can be supplied to the pipelined multiplier. Additionally since this projection results in a coarse grained pipeline, only a single input and output stream is required. This simplifies the control and memory interface to the array. This is important since the SA will be applied to a polymorphic SA that must remain generic enough to handle many different SAs.

Figure 7:
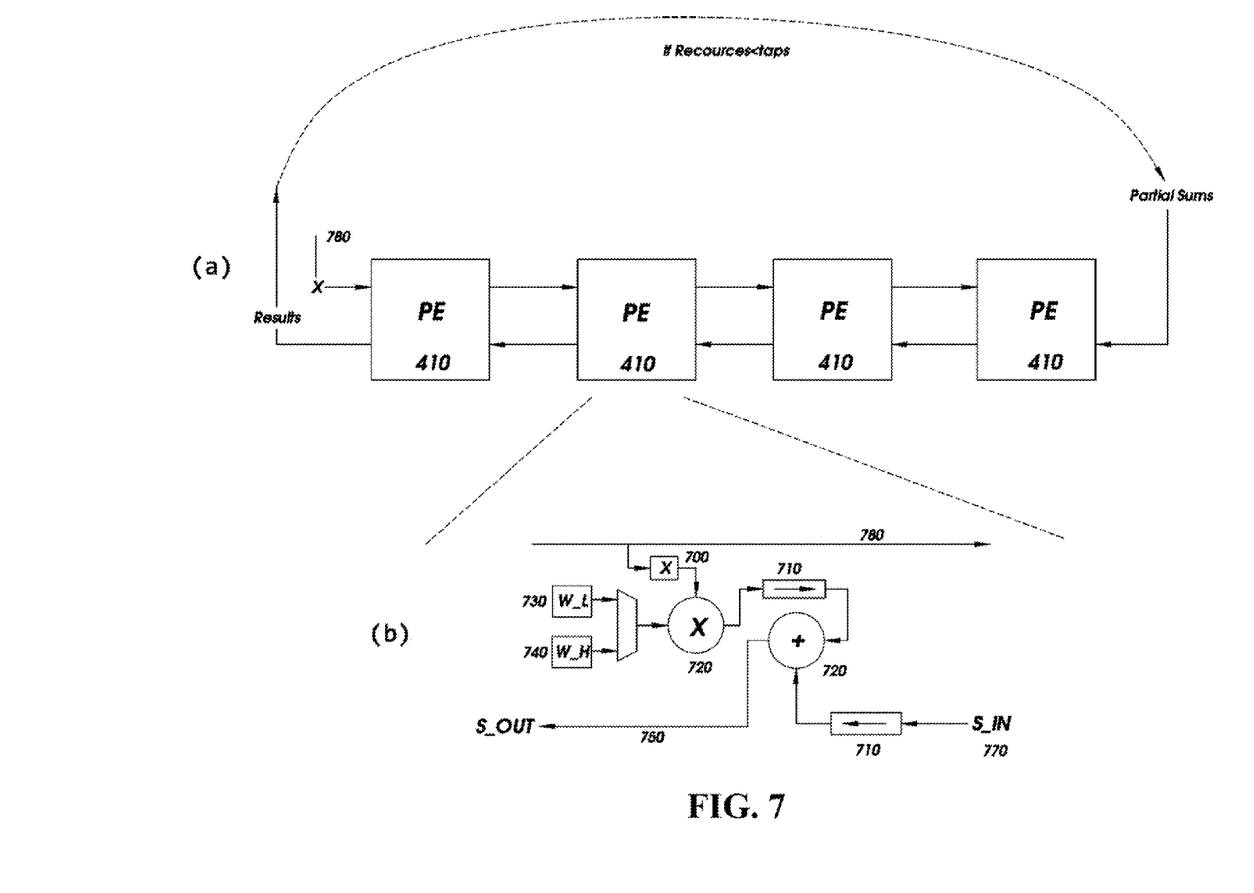
FIG. 7: (a) Architecture of the single precision floating-point DSA. (b) Internal architecture of a DSA PE.

The systolic array implementation of the DSA (DWT systolic array) shown in FIG. 7 is another embodiment wherein we have added buffers to allow usage of pipelined single precision floating-point. The input is fed in at the left of the systolic array while partial sums are fed from right to left performing a convolution. Since the output is decimated by 2, only half of the operations are required, so each PE will ignore every other input. Each PE consecutively computes both the low-pass and high-pass result. If the number of taps is greater than the number of available PEs each level must be ran multiple times $$\left(\left[\left[\frac{W}{R}\right]\right]\right)$$

times, where W is the number of taps and R is the number resources/sockets) by passing the output of the SA to the partial sums input of the last PE (symbolized as a dotted line in FIG. 7). Therefore the DSA computes per run, a high pass filter operation, a low pass filter operation and decimation by two. This results in the need for three such runs to compute the LL (lo-low), LH (low-high), HL (high-low) and HH (high-high) sub-images for one level of decomposition. There are several ways to support multiple levels of decomposition know to those skilled in the art. In one embodiment a simple approach is adopted of using the microprocessor to run software necessary to schedule the appropriate data and tasks onto the co-processor.

The PDR process consists of decompression software running on the MicroBlaze (specifically run length encoding (RLE)) that consumes off-line compressed PB of a socket, stored on BRAMs. One reason for storing partial bitstreams on BRAMs is to avoid the alternative of storing them on an external compact Flash card on the FPGA board which involves large delays in reading, adversely affecting reconfiguration times. The decompression software can produce up to 128 bytes of bitstream per iteration which are stored on the processor's memory (software buffer). Then the processor executes the bitstream relocation software that consumes the 128 bytes of the PB and modifies the frame address to enable relocation into a different socket. The relocated bitstream is then sent to the OPB HWICAP buffer (capacity of 2K bytes). Therefore the decompression and relocation software is run iteratively until the ICAP buffer is filled. At this point, the MicroBlaze executes control software to trigger the ICAP which then performs the configuration of the device. This is effective at avoiding the need to allocate a much greater number of BRAMs to store multiple uncompressed PBs for each socket (88KB each for our test cases).

The reason for choosing a bitstream relocation method was based on a salient feature of systolic arrays: The PEs are architecturally identical. However even for identical architectures the resulting PBs are different because frame addresses (components of any bitstream) are unique to a physical location on the device, requiring a different PB for every PR region housing an architecturally identical PE. It is inefficient to store several such PBs on BRAMs. It is more efficient to store a single version of each type of possible PE and relocate to the desired PR region. Efficient decompression of bitstreams is supported by integrating the RLE decompression algorithm into the relocation software to get the next word in the bitstream. However, invoking this style of bitstream relocation requires that there be no static routes passing through a PR region because it only relocates frame addresses and does not alter logic/routing contents (necessary in the case of relocating PR regions containing static routing).

In the layout of the floor plan for one embodiment of the system architecture the sockets (PR regions) of the Polymorphic systolic array framework have distributed on the left side of the chip and the components of the static region (MicroBlaze, pseudo-cache, controller, switch boxes, etc.) are distributed on the right side of the chip, except for one clock region on the left side that is also allocated for the static region. This clock region was allocated as part of the static region because: (i) there is an I/O port that connects to the System ACE on the ML402 board, requiring a static route through this clock region, which prohibits relocating a PB to it of the dimensions in this design. (ii) Additional BRAMs were required for the Microprocessor memory and pseudo-cache that were in scarcity, hence making them unavailable for a sixth socket. The busmacros have been stacked on the right side of the sockets, to avoid necessitating any static routes passing through the PR regions. No static signals cross the PR boundaries except for clock signals.

Since we do not define two PR regions stacked vertically in one clock region, we limited the height of a PR region to one clock region. This led us to explore any needed increase in the logic packed in a PR region horizontally, rather than vertically across clock regions. This design allows for the inclusion of two or more smaller PEs within a socket. However this decreases the granularity of reconfiguration as well as interconnections. Therefore we retained a simple framework for the test cases where only one PE resides in a socket which resides in one clock region.

All example cases where run on (a) Xilinx Virtex4 SX35 based ML 402 board running at 100 MHz and compared to software implementations on a Virtutech Simics PowerPC 750 simulator [20] running at 150 MHz (equivalent to the embedded RAD750 used in many space applications). The FPGA based design ran the EKF algorithm 4.1 8× faster for the example on an autonomous UAV (unmanned air vehicle) and related parameters: number of states=10, number of measurements=9, number of control inputs=6. This translates to the dimensions of the matrices of the Faddeev algorithm ($A_{N \times N}$, $B_{N \times M}$, $C_{P \times N}$, $D_{P \times M}$) as follows for the linear operations in terms of 3-tuples (N, M, P are the input dimensions to the Faddeev algorithm per iteration): state error covariance prediction (10,10,10; 10,10,10), measurement residual (1,1,9), covariance of the measurement residual (10,9,10; 10,9,9), Kalman gain calculation (9,9,10), state estimate update (9,10,10) and state error covariance estimate update (9,10,10; 10,9,10). The FPGA based design ran the 2D DWT algorithm 6.61× faster for the 2D DWT algorithm, where the matrix size=64×64 and the number of taps of the High pass and Low pass filters was 4.

For the example case of the Polymorphic systolic array framework in full FSA configuration, we observed that from the perspective of the microprocessor, 45% of the time was spent controlling accelerated operations, 25% was spent doing non-linear operations, and 29% was spent transferring data to or from the co-processor. Furthermore we observed that 45% of the time was spent on the microprocessor and 55% on the accelerator. For the DSA mode of operation, 31% of the time was spent on data transfers and 69% of the time was spent on data computations on the accelerator. The performance of the pseudo-cache for the EKF test cases was 85% hit rate at the granularity of a word (32 bits) since a word is the smallest unit of data that can be replaced in the cache from the microprocessor's memory. However for the DWT, there were no pseudo-cache misses because the entire image was preloaded prior to access by the Polymorphic systolic array framework and intermediate LP/HP filter results (after row based operations) were carefully managed on the pseudo-cache for the next set of LP/HP operations along columns. The area occupied by a FSA-PE was 344 Slices, 8 DSPs, 3 FIFOs. The area occupied by a DSA-PE was 724 Slices, 8 DSPs, 5 FIFOs.

There are several factors that affect the reconfiguration latency in this design, including: the size of the PB, time for address relocation, location of the PR, time for bitstream decompression, and external memory latency. The uncompressed PB for a socket configured as either a FSA-PE or a DSA-PE is the same (88KB i.e. 44 BRAMs). However the RLE compressed PB for a FSA-PE is 59KB and DSA-PE is 39KB. Some of more important observations made are summarized, assuming the following conventions: F→PB stored on flash card, C→PB is compressed and decompression is performed by the MicroBlaze, B→PB is stored on BRAM, R→PB is relocated with source and destination sockets on the same side of the meridian line, PB is relocated with source and destination sockets on different sides of the meridian line.

- <B> reduces the reconfiguration latency by 86% compared to <F>. This is the fastest reconfiguration method, but requires significant use of valuable BRAMs (44 for every PE's PB).
- <B, C> reduces the number of BRAMs needed by a factor of 2 compared to <B>, but the decompression process (in software) increases the reconfiguration time by approximately 150%.
- <B, R> added a negligible overhead over <B>, but avoided the need for extra sets of BRAMs to store a PB for each socket.
- The performance of <B, C, R> was similar to <B, C>, but was significantly poorer for <B, C, M> because
- the contents of each frame have to be bit-reversed when relocating from one side of the chip to the other.

Hence <B, C, R> performed about 2.7× better than <F>.

The above description discloses the invention including preferred embodiments thereof. The examples and embodiments disclosed herein are to be construed as merely illustrative and not a limitation of the scope of the present invention in any way. It will be obvious to those having skill in the art that many changes may be made to the details of the above-described embodiments without departing from the underlying principles of the invention.

We claim:

1. An FPGA system comprising:
    a microprocessor;
    a coprocessor with a pseudo-cache;
    a controller;
    a polymorphic systolic array framework comprising a reconfigurable partial region based sockets to accelerate algorithms amenable to being mapped onto linear systolic arrays;
    said microprocessor and said coprocessor and said controller and said polymorphic systolic array framework are communicably coupled;
    wherein EKF and DWT algorithms are mapped onto said architecture; and
    on-chip bitstream decompression/relocation methods used to facilitate the dynamic scaling of said polymorphic systolic array framework.

2. A polymorphic systolic array system comprising:
    reconfigurable partial region based sockets; and
    on-chip bitstream decompression/relocation methods are used to facilitate the dynamic scaling of said polymorphic systolic array framework.

3. The polymorphic systolic array system of claim 2 wherein:
    said polymorphic systolic array framework accelerates algorithms amenable to being mapped onto linear systolic arrays.

4. The polymorphic systolic array system of claim 2 further comprising:
    an extended Kalman filter algorithm mapped onto said polymorphic systolic array system.

5. The polymorphic systolic array system of claim 2 further comprising:
    a discrete wavelet transform algorithm is mapped onto said polymorphic systolic array system.

6. The polymorphic systolic array system of claim 2 further comprising:
    switch boxes wherein said switch boxes enable communication between static and partial reconfigurable regions; and
    a protocol to enable schedule changes when said socket's contents are dynamically reconfigured to alter the concurrency of the participating systolic arrays.

7. The polymorphic systolic array system of claim 2 further comprising:
    a hybrid PDR method that combines early access partial reconfiguration (EAPR), on-chip bitstream decompression and bitstream relocation to enable fast scaling of said systolic arrays.

8. A systolic array system comprising:
    reconfigurable partial region based sockets;
    a microprocessor communicably coupled to said reconfigurable partial regions based sockets; and
    on-chip bitstream decompression/relocation methods are used to facilitate the dynamic scaling of said polymorphic systolic array framework.

9. The systolic array system of claim 8 wherein:
    said systolic arrays are polymorphic.

10. The systolic array system of claim 9 further comprising:
    a coprocessor communicably coupled to said reconfigurable partial regions based sockets.

11. The systolic array system of claim 10 further comprising:
    a pseudo-cache communicably coupled to said coprocessor.

12. The systolic array system of claim 11 further comprising:
    a controller communicably coupled to said microprocessor.

13. The systolic array system of claim 12 further comprising bitstream relocation.

14. The systolic array system of claim 13 wherein:
    said bitstream relocation involves slightly modifying the contents of a partial bitstream to mould it into a form that can be loaded onto a similar but different partial configuration region on the device.

* * * * *